US008603837B1

(12) United States Patent
Foster

(10) Patent No.: US 8,603,837 B1
(45) Date of Patent: Dec. 10, 2013

(54) HIGH PRODUCTIVITY COMBINATORIAL WORKFLOW FOR POST GATE ETCH CLEAN DEVELOPMENT

(75) Inventor: John Foster, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/562,564

(22) Filed: Jul. 31, 2012

(51) Int. Cl.
  *H01L 21/66* (2006.01)
  *H01L 21/302* (2006.01)
  *H01L 21/461* (2006.01)
  *C23F 1/00* (2006.01)

(52) U.S. Cl.
  USPC ............. 438/14; 438/745; 438/749; 438/750; 438/754; 216/84

(58) Field of Classification Search
  USPC ................... 438/14, 745, 748, 749, 750, 754; 216/84
  See application file for complete search history.

(56) References Cited

U.S. PATENT DOCUMENTS

| | | | | |
|---|---|---|---|---|
| 5,454,901 A | * | 10/1995 | Tsuji | 438/704 |
| 6,725,119 B1 | * | 4/2004 | Wake | 700/121 |
| 7,247,346 B1 | * | 7/2007 | Sager et al. | 427/162 |
| 7,544,574 B2 | | 6/2009 | Chiang et al. | |
| 7,871,928 B2 | | 1/2011 | Chiang et al. | |
| 7,902,063 B2 | | 3/2011 | Chiang et al. | |
| 8,084,400 B2 | | 12/2011 | Chiang et al. | |
| 2006/0272677 A1 | * | 12/2006 | Lee et al. | 134/3 |
| 2006/0292845 A1 | * | 12/2006 | Chiang et al. | 438/597 |
| 2007/0202610 A1 | | 8/2007 | Chiang et al. | |
| 2007/0202614 A1 | | 8/2007 | Chiang et al. | |
| 2009/0212021 A1 | * | 8/2009 | Bernhard et al. | 216/109 |
| 2009/0281016 A1 | * | 11/2009 | Cooper et al. | 510/176 |
| 2010/0018553 A1 | * | 1/2010 | Mikhaylichenko et al. | 134/18 |
| 2010/0167514 A1 | * | 7/2010 | Kirkpatrick et al. | 438/587 |
| 2010/0175715 A1 | * | 7/2010 | Kumar et al. | 134/3 |

FOREIGN PATENT DOCUMENTS

| | | |
|---|---|---|
| WO | WO-2007-095194 A2 | 8/2007 |
| WO | 2010075715 A1 | 7/2010 |

* cited by examiner

*Primary Examiner* — Mary Wilczewski
*Assistant Examiner* — Erik T Peterson

(57) ABSTRACT

Combinatorial workflow is provided for evaluating cleaning processes after forming a gate structure of transistor devices, to provide optimized process conditions for gate stack formation, including metal gate stack using high-k dielectrics. NMOS and PMOS transistor devices are combinatorially fabricated on multiple regions of a substrate, with each region exposed to a different cleaning chemical and process. The transistor devices are then characterized, and the data are compared to categorize the potential damages of different cleaning chemicals and processes. Optimized chemicals and processes can be obtained to satisfy desired device requirements.

20 Claims, 14 Drawing Sheets

HIGH PRODUCTIVITY COMBINATORIAL WORKFLOW FOR POST GATE ETCH CLEAN DEVELOPMENT

FIELD OF THE INVENTION

The present invention relates generally to combinatorial methods for device process development. More specifically, combinatorial methods of developing fabrication and cleaning processes for metal gate electrode devices with regard to wet process chemicals, such as dilute metal etch chemicals.

BACKGROUND OF THE INVENTION

Advances in semiconductor processing have demanded ever-increasing high functional density with continuous size scaling. This scaling process has led to the adoption of high-k gate dielectrics and metal gate electrodes in metal gate stacks in semiconductor devices.

High-k gate dielectrics can offer a way to scale down the thickness of the gate dielectric with acceptable gate leakage current. The use of high-k gate dielectrics is often accompanied by a metal gate electrode, since thin gate dielectric layers may cause poly depletion, affecting the device operation and performance.

The introduction of metal elements to the device, e.g., in the formation of the metal gate electrode, can impose significant changes to the device fabrication process, including device structure designs to reduce leakage, process chemistry to pattern metallic structures and avoid metal corrosion, and cleaning chemistry to remove metallic-containing residues.

Further, advanced semiconductor devices also use advanced gate dielectric in addition to the metal gate electrode. The advanced gate dielectric can comprise ultra-thin silicon dioxide, for example, less than 5 nm thick, which poses tunneling problems. The advanced gate dielectric can comprise a high-k material, which imposes additional challenges to the device fabrication process. For example, in some portions of the fabrication, etch processes with very high selectivity chemistries and conditions are needed, for example, to avoid gate dielectric punch through or to avoid damage to the device, such as corner damage to the metal gate structure.

The manufacture of high-k dielectric and metal gate devices entails the integration and sequencing of many unit processing steps, with potential new process developments, since in general, high-k gate dielectrics are much more sensitive to process conditions than silicon dioxide. For example, the precise sequencing and integration of the unit processing steps can enable the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, HPC processing techniques have not been successfully adapted to the development of wet chemicals to post metal gate etch clean development.

Therefore, there is a need to apply high productivity combinatorial techniques to the development and investigation of liquid materials and wet processes for the manufacture of high-k and metal gate devices.

SUMMARY OF THE DESCRIPTION

In some embodiments, the present invention discloses a cleaning process after forming a gate structure of transistor devices. The cleaning process can selectively remove polymer, such as organic polymer, formed on a sidewall of a metal gate electrode during a gate patterning step, such as a reactive ion etching step. In addition, the cleaning process can selectively etch a metal-containing layer of the metal gate electrode to form an undercut with respect to the remaining layers of the metal gate electrode. The undercut of the metal-containing layer, and optionally the gate dielectric layer, can reduce the vertical electric field between the metal gate electrode and the portion of the source and drain of the semiconductor device that extends under the gate dielectric layer, which then can reduce the leakage current of the semiconductor device.

In some embodiments, the present invention discloses combinatorial workflow for evaluating cleaning processes after forming a gate structure of transistor devices, to provide optimized process conditions for gate stack formation, including metal gate stacks using high-k dielectrics. NMOS and PMOS transistor devices are combinatorially fabricated on multiple regions of a substrate, with each region exposed to a different cleaning chemical and process. The transistor devices are then characterized, and the data are compared to categorize the potential effects of different cleaning chemicals and processes. Optimized chemicals and processes can be obtained to satisfy desired device requirements.

In some embodiments, the combinatorial workflow includes evaluating different cleaning chemicals, such as HCl and dilute sulfuric peroxide, different sequences of cleaning chemical applications, different strengths, time and temperatures of the cleaning chemicals.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
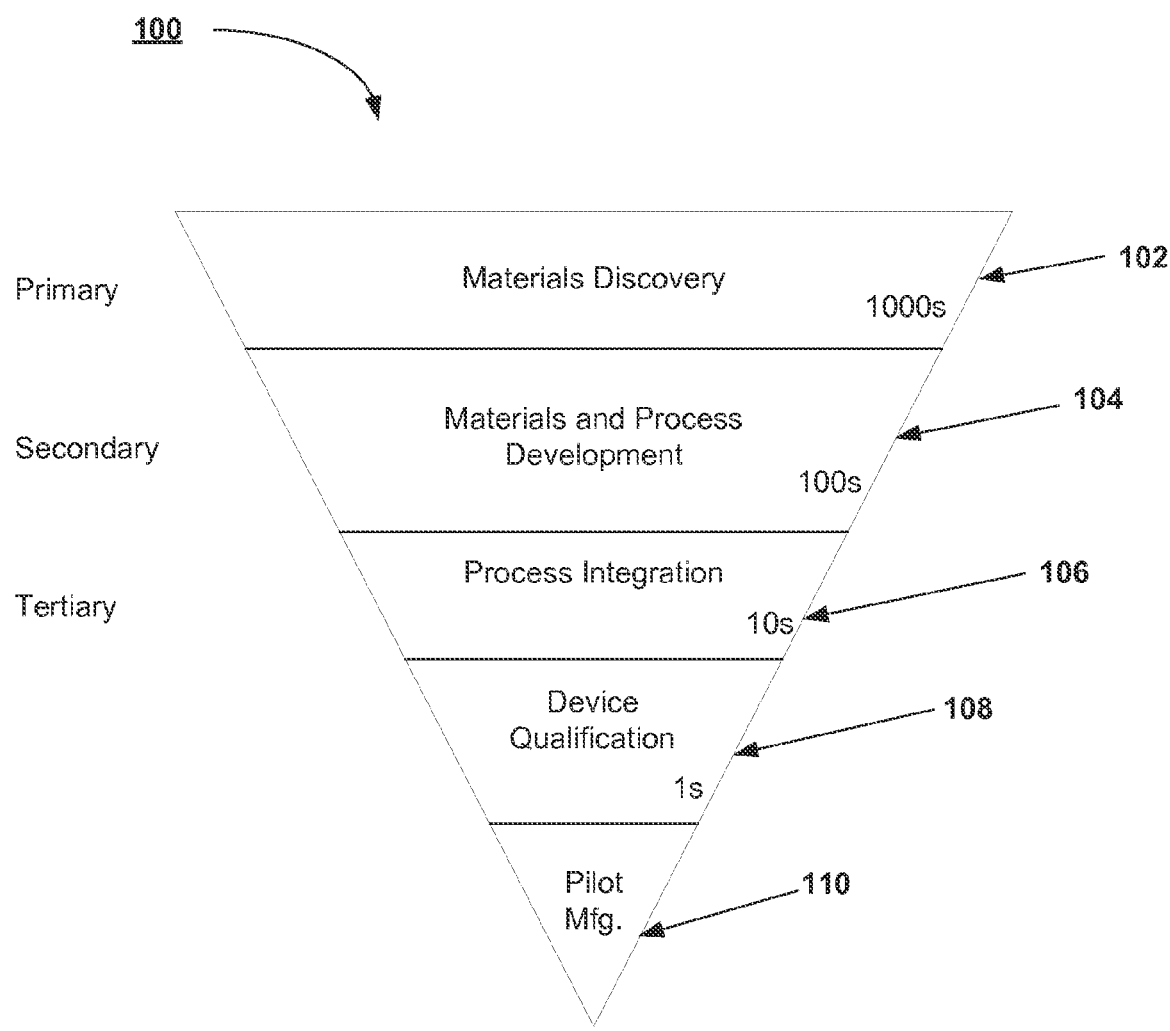
FIG. 1 illustrates a schematic diagram for implementing combinatorial processing and evaluation using primary, secondary, and tertiary screening.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses development of a post gate etch cleaning process for NMOS (n-channel metal oxide semiconductor field effect transistor) and PMOS (p-channel metal oxide semiconductor field effect transistor) structures using a combinatorial workflow. Advanced devices can utilize novel materials and structures, such as high-k gate dielectrics and/or metal gate electrodes, which might experience performance side effects under exposure to wet cleaning processing chemicals, such as metal undercut. The combinatorial workflow can identify the performance of the fabricated devices, permitting a selection of wet processing chemicals and processing conditions to optimize the device performance in the fabrication of semiconductor devices.

In some embodiments, the present invention discloses combinatorial workflow for evaluating process conditions for metal gate stack formation, including metal gate stack using high-k dielectrics. NMOS and PMOS devices are combinatorially fabricated on multiple regions of a substrate, with each region exposed to a different dilute metal etch chemical and process conditions. The NMOS and PMOS devices are then characterized, and the data are compared to categorize the performance and potential damages of different dilute metal etch chemicals and processing conditions and identify suitable fabrication processes based on desired device requirements.

In the following description, methods for evaluating processing conditions and wet chemicals are illustrated using a simple planar structure. Those skilled in the art will appreciate that the description and teachings to follow can be readily applied to any simple or complex testing methodology. The drawings are for illustrative purposes only and do not limit the application of the present invention.

"Combinatorial Processing" generally refers to techniques of differentially processing multiple regions of one or more substrates. Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.).

Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

FIG. 1 illustrates a schematic diagram for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of high-k device fabrication process with metal gate by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a high-k device. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the high-k device. For example, such structures may include, but would not be limited to, high-k dielectric layers, metal gate layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
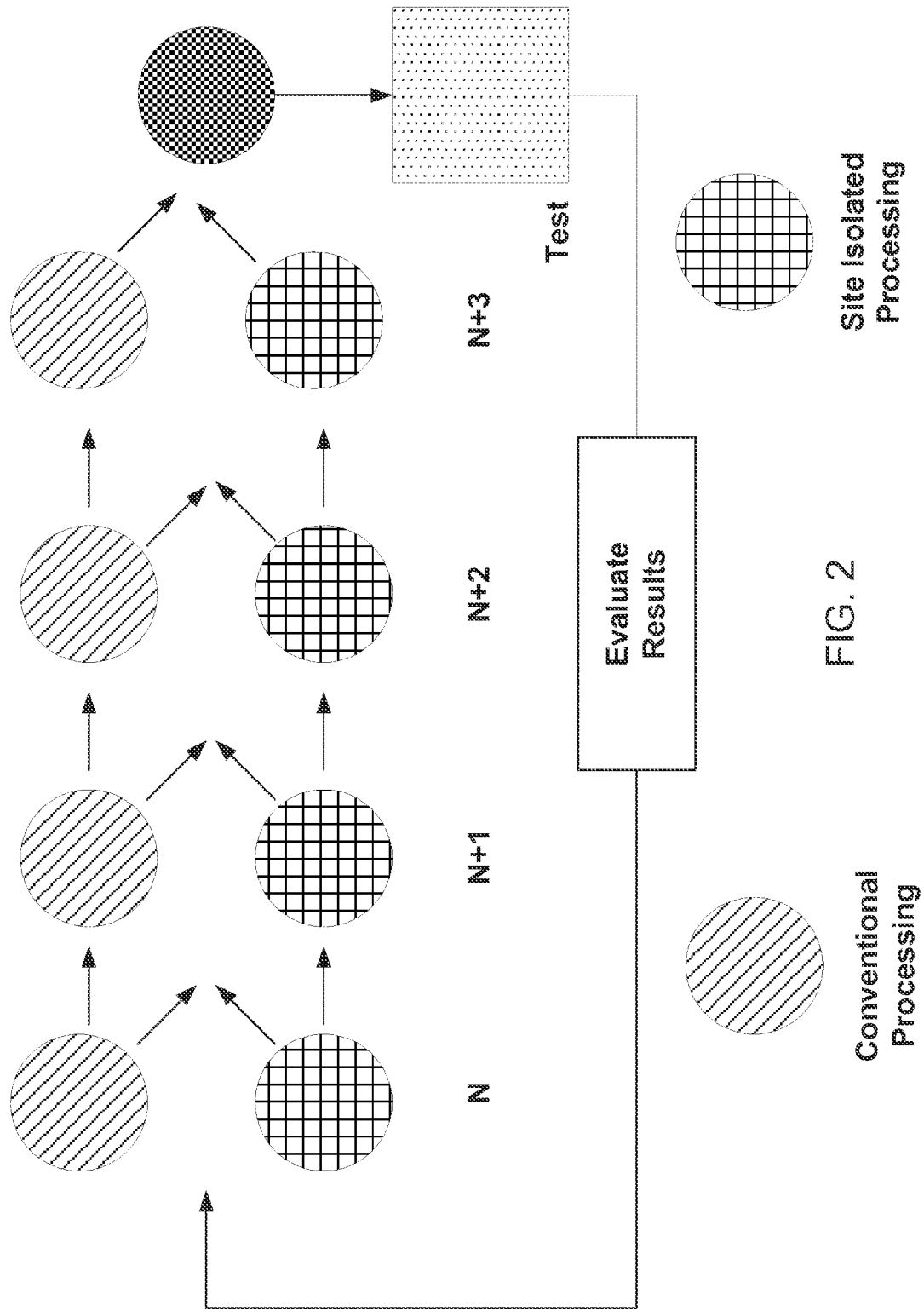
FIG. 2 is a simplified schematic diagram illustrating a general methodology for combinatorial process sequence integration that includes site isolated processing and/or conventional processing in accordance with some embodiments of the invention.

FIG. 2 is a simplified schematic diagram illustrating a general methodology for combinatorial process sequence integration that includes site isolated processing and/or conventional processing in accordance with some embodiments of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
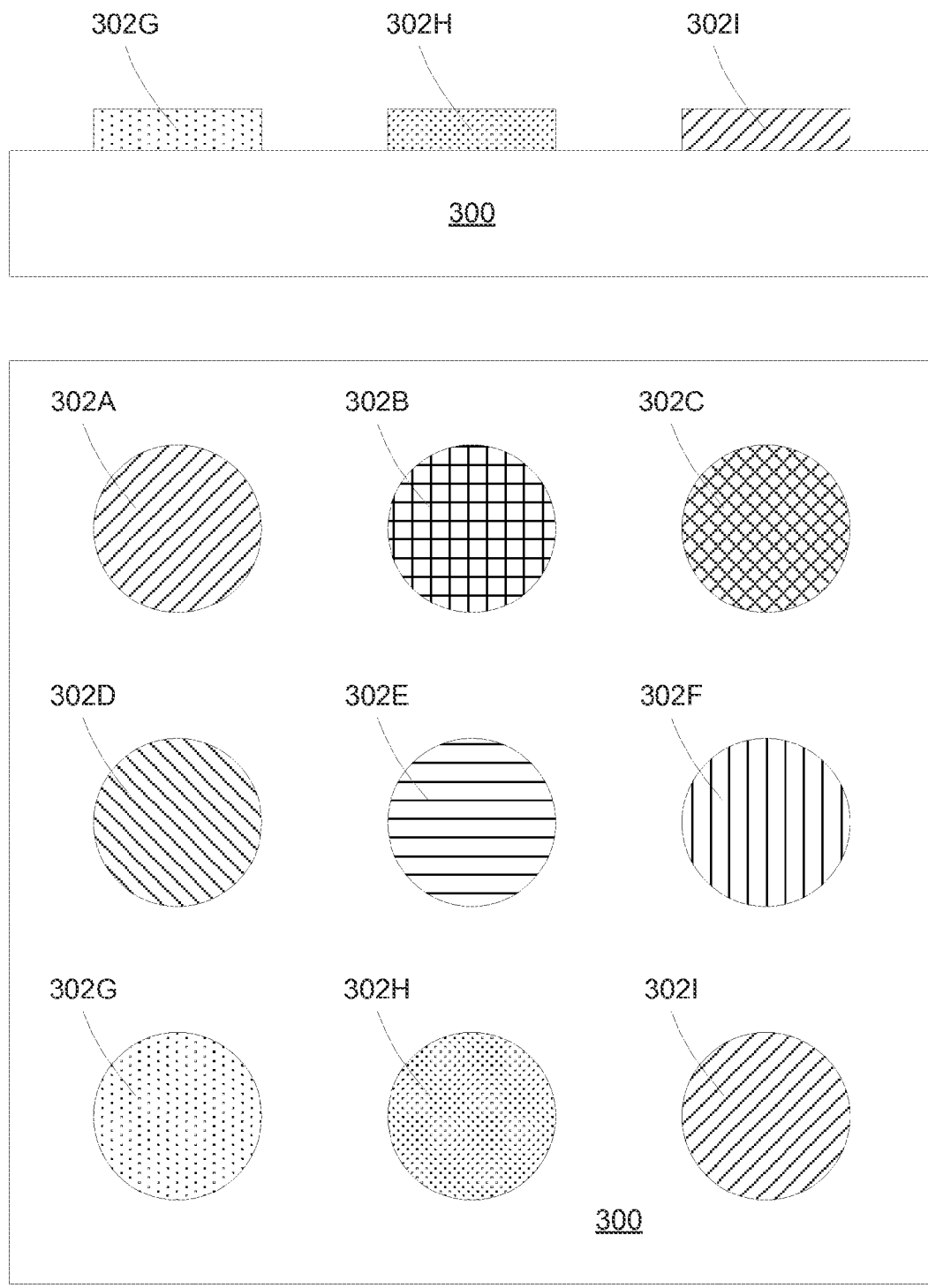
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302a-302i, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302g-302i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
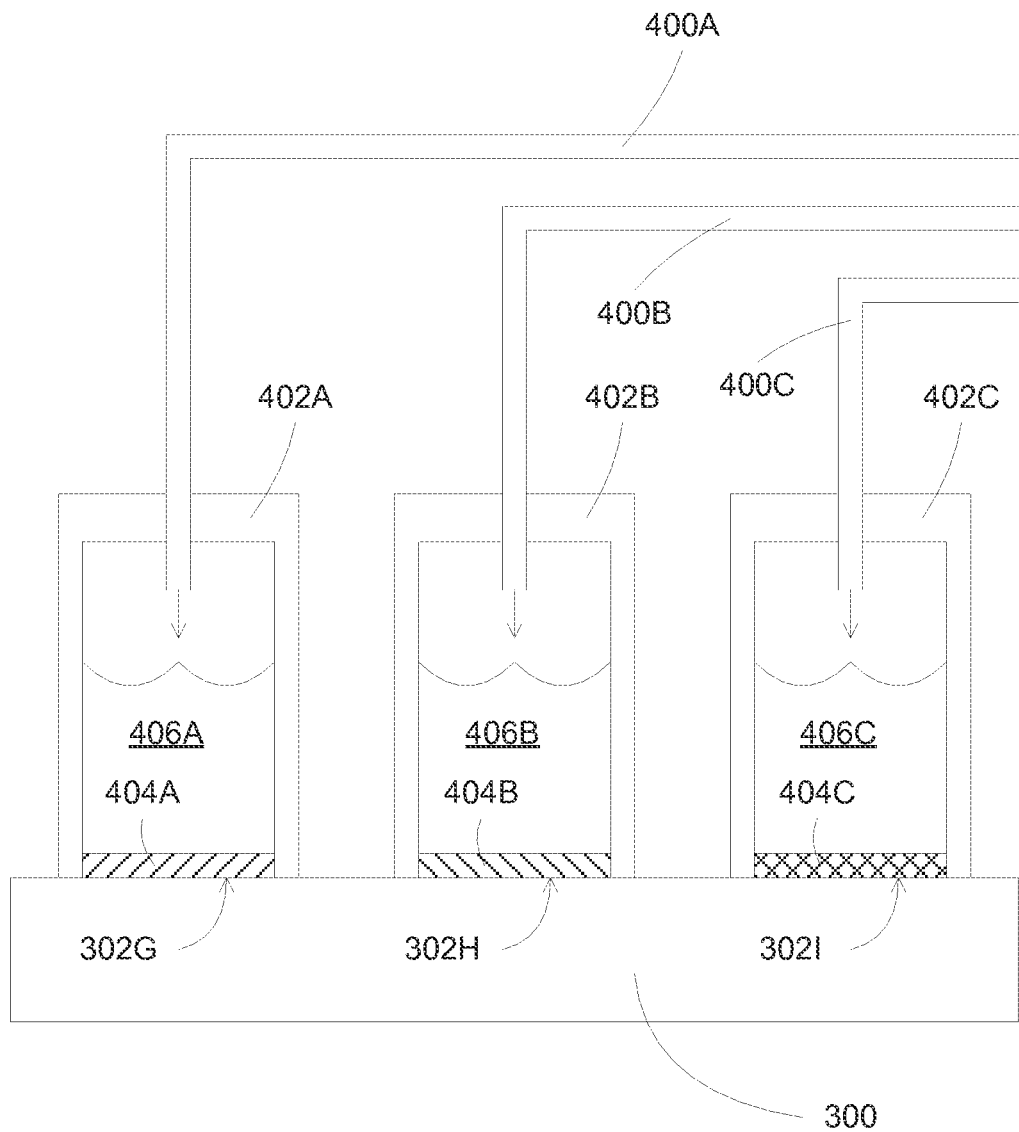
FIG. 4 illustrates a schematic diagram of a combinatorial wet processing system according to some embodiments described herein.

FIG. 4 illustrates a schematic diagram of a combinatorial wet processing system according to some embodiments described herein. A combinatorial wet system may be used to investigate materials deposited by solution-based techniques. Those skilled in the art will realize that this is only one possible configuration of a combinatorial wet system. FIG. 4 illustrates a cross-sectional view of substrate, 300, taken through the three site isolated regions, 302g-302i similar to the upper portion of FIG. 3. Solution dispensing nozzles, 400a-400c, supply different solution chemistries, 406a-406c, to chemical processing cells, or reactors, 402a-402c. FIG. 4 illustrates the deposition of a layer, 404a-404c, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the present invention discloses systems and methods for generating site isolated regions on a substrate, allowing combinatorial processing without cross contamination between regions. The site isolated regions are sealed against the substrate through a sealing mechanism that can be effective for different substrate surface conditions, including surface layer removal at the sealing interface.

In some embodiments, the present invention discloses characterizations of NMOS and PMOS semiconductor devices to identify processing chemicals or fabrication conditions that can affect the device performance. The processing chemicals can be cleaning chemicals, wet etch chemicals, or metal etch chemicals. The fabrication conditions can include chemical temperature, chemical concentration, processing time or sequence of applying chemicals. In the following description, dilute metal etch chemicals such as HCl or dilute sulfuric peroxide are described, but the invention is not so limited, and can be used for evaluating any wet processing chemical.

Advanced semiconductor devices can employ novel materials such as metal gate electrodes and high-k dielectrics, which comprise dielectric materials having a dielectric constant greater than that of silicon dioxide. Typically high-k dielectric materials include aluminum oxide, hafnium oxide, zirconium oxide, tantalum oxide, titanium oxide, or their alloys such as hafnium silicon oxide or zirconium silicon oxide. Metal gate materials typically comprise a refractive metal or a nitride of a refractive metal, such as tungsten nitride, tantalum nitride, titanium nitride, titanium aluminum nitride, or titanium lanthanum nitride. Alternatively, the metal gate layer 722 can include other metals, including hafnium, zirconium, titanium, tantalum, aluminum, ruthenium, palladium, platinum, cobalt, nickel, and conductive metal oxides (e.g., $RuO_2$). High-k dielectric and metal electrode materials can be highly sensitive to wet processing chemicals, and can exhibit device degradation if improper chemicals or process conditions are used.

In some embodiments, the present invention provides structures and methods for patterning a metal gate electrode, for fabricating semiconductor devices and integrated circuits including the same. The methods for patterning the metal gate electrode can include forming a metal-containing layer over a gate dielectric layer, and patterning the metal gate electrode using a wet etch process such as a dilute metal etch chemical.

With the reduction of gate stack lateral and thickness dimensions, poly silicon gates can deteriorate the performance characteristics of the device, for example, by a depletion effect of charge carriers at the interface of poly silicon electrode and gate dielectric in inversion modes. The depletion can limit further scaling of silicon semiconductor devices.

Metal gate electrode can offer more charge carriers than doped poly silicon, and during inversion, there can be no substantial depletion of charge carriers. Various metal gates electrode structures can be used, for example, a lower metal layer and an upper poly silicon layer, or a lower first metal layer and an upper second metal layer.

In some embodiments, the present invention discloses a wet etch process for the fabrication of a metal gate electrode, and for integrating the fabrication of metal gate electrodes into existing of semiconductor device manufacturing processes. The present wet etch process utilizes a dilute metal etch solution, such as HCl or a dilute sulfuric peroxide solution, including a high percentage of water, sulfuric acid (e.g., for etching metal components) and hydrogen peroxide (e.g., for oxidizing the metal components). Additional components can be added to the dilute sulfuric peroxide to further improve the wet process.

In some embodiments, the present invention discloses methods to evaluate potential impact of various chemistries and processes on transistor performance and reliability, including characterizing NMOS and PMOS metal gate stacks in device structures.

Figure 5:
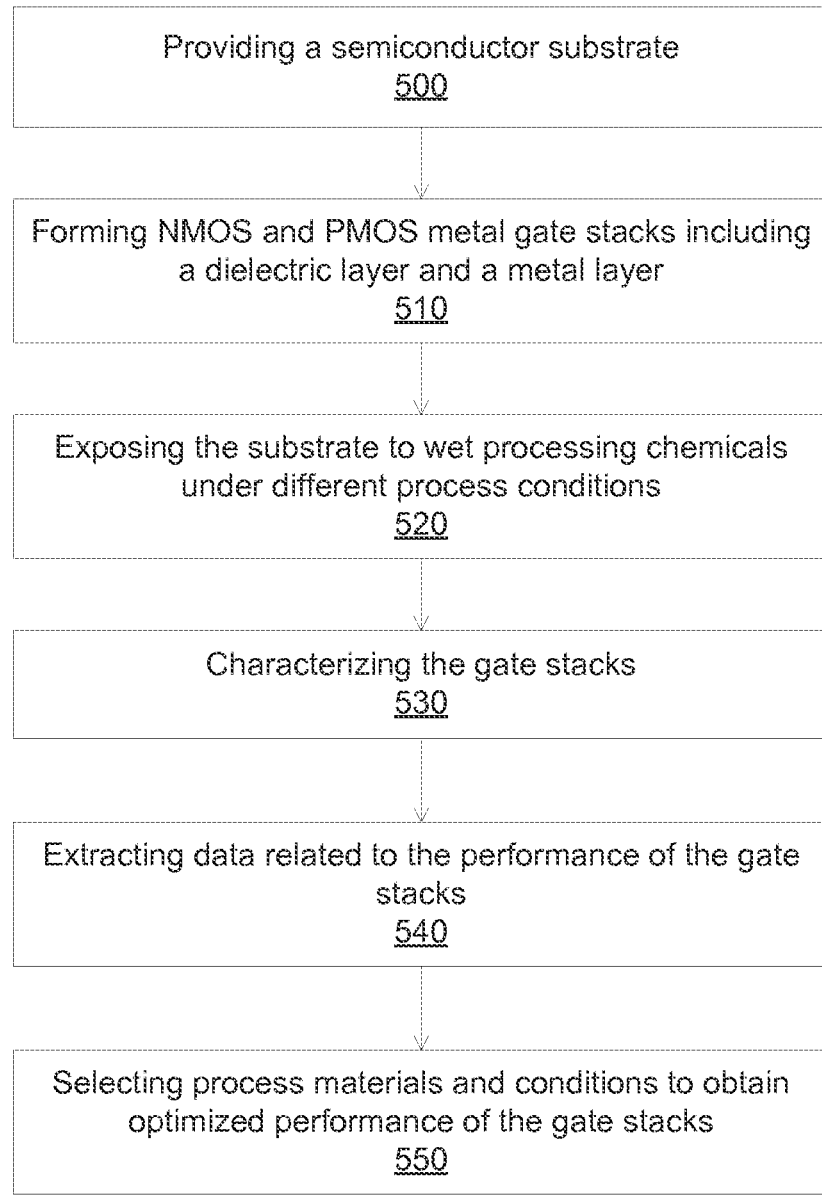
FIG. 5 illustrates a flowchart for a post gate etch process development according to some embodiments of the present invention.

FIG. 5 illustrates a flowchart for a post gate etch process development according to some embodiments of the present invention. During the fabrication of NMOS and PMOS gate stacks, representing the metal gate electrode of NMOS and PMOS transistor devices, the structures are exposed to a dilute metal etch chemical under different process conditions. The characterization of the NMOS and PMOS gate stacks can indicate the performance and possible side effects of the wet process chemical, permitting a quick ranking of various chemicals and process conditions. Poor performance chemicals and conditions can be identified and removed without the need to fabricate and test fully-operational devices.

In operation 500, a semiconductor substrate is provided. The semiconductor substrate can be a silicon-containing substrate, a germanium-containing substrate, an III-V or II-VI substrate, or any other substrate containing a semiconductor element. In operation 510, NMOS and PMOS metal gate stacks are fabricated, including forming a dielectric layer on the semiconductor substrate and a metal electrode layer on the dielectric layer. The dielectric layer, including silicon oxide or a high-k dielectric material, can be deposited on the whole substrate. The electrode layer can include a refractive metal or a nitride of a refractive metal, is deposited on the dielectric layer. Photolithography patterning processes can be performed, etching the electrode and the dielectric layer to form NMOS and PMOS gate stacks.

In operation 520, the substrate, including the NMOS and PMOS metal gate stacks, is exposed to wet processing chemicals, such as HCL or a dilute sulfuric peroxide, under different process conditions. For example, the substrate can be submerged in a liquid bath containing the chemicals. Alternatively, the chemicals can be disposed on the substrate for a certain time before being removed. The exposure can be performed after the patterning of the metal gate stacks, to evaluate the effect of the chemicals and the process conditions on the gate stacks. Optional processing steps can be added, such as a cleaning step or a rinsing step, to simulate the actual transistor fabrication processes.

In operation 530, the NMOS and PMOS gate stacks, including an electrode disposed on a dielectric layer on the semiconductor substrate, can be characterized. The characterization can include structural observation, such as by SEM (scanning electron microscope), for example, to determine the removal or the remaining of polymer residues on the gate stacks. The characterization can also include evaluating the undercut of the metal layer in the metal gate stack, which can be different for NMOS and for PMOS devices.

In some embodiments, control devices are also fabricated and tested. The control devices are fabricated in the same process steps as the test devices, together with a standard chemical exposure step. Comparing the test devices and the control devices can enable the observation of the performance difference as compared to established fabrication processes.

In operation 540, data related to the performance of the device are extracted from the electrical test. In operation 550, chemicals and process conditions are selected based on a comparison of the device performance.

In some embodiments, the characterization of NMOS and NMOS device with exposure to various wet etch chemicals under different process conditions can offer a list of process compatibility between multiple chemicals and other materials and conditions of the devices, such as the high-k material or the metal gate material. This list can enable the optimum device fabrication process, at least with respect to the selection of etch chemicals and process conditions, such as temperature, time, concentration, and sequence of chemical applications.

In some embodiments, the present invention discloses a method to fabricate a device, comprising forming a multilayer metal gate electrode over a gate dielectric layer on a substrate, and patterning the multilayer metal gate electrode. The multilayer metal gate electrode can comprise a metal-containing layer such as TiN and a conductor layer such as poly silicon. The gate dielectric layer can comprise a high-k material.

The multilayer metal gate electrode can be patterned, for example, by a plasma etch process, to expose a sidewall of the metal-containing layer, which then can be selectively etched in a dilute sulfuric peroxide solution to form an undercut of the metal-containing layer. The dilute sulfuric peroxide solution can include about 50% to 80% by weight of water, a sulfuric acid component of less than 30% to less than 10% by weight, and a hydrogen peroxide component, which can be less than about 30% to less than about 10% by weight. In some embodiments, the dilute sulfuric peroxide solution can further include about less than 100 ppm of hydrofluoric acid.

The dilute sulfuric peroxide solution can selectively etch the metal-containing layer of the metal gate electrode to form an undercut with respect to the gate conductor layer. In some embodiments, the gate dielectric layer can also be selectively etched, in addition to the metal-containing layer, with respect to the gate conductor layer. The undercut of the metal-containing layer can be controlled to achieve a desired profile of the undercut, such as a straight recess of the metal-containing layer.

In some embodiments, the patterning process of the multilayer metal gate electrode can generate an organic polymer coating on the metal gate electrode layer, which can be cleaned with the selective wet etch process comprising dilute sulfuric peroxide solution. The dilute sulfuric peroxide solution can selectively clean the organic polymer with respect to the metal gate electrode before the undercut formation process.

In some embodiments, the present wet process is performed to selectively clean a polymer component with respect to a semiconductor or a dielectric component. During the patterning of a metal gate electrode, polymer is generated and then re-attached to the metal gate structure. The polymer can be an organic polymer, and can comprise trace amounts of metal, for example, from the metal layer. The wet process can comprise selective etching of the generated polymer, without or with minimum damage to the metal gate electrode. The dilute acid peroxide can have high etch rate for polymer, together with high etch rate for metal components, thus can effectively clean metal contaminated polymer generated from an etching of metal gate layer.

In some embodiments, the present invention discloses a wet process to form a metal gate electrode with minimum damage, cleaned structure, and high controllability. The present invention further discloses semiconductor devices and integrated circuits utilizing the fabricated metal gate electrode.

Figure 6A:
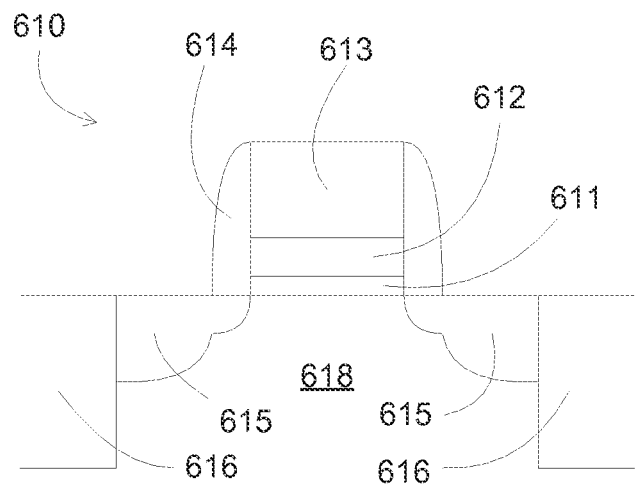
FIGS. 6A-6B illustrates examples of metal gate electrode devices according to some embodiments of the present invention.
Figure 6B:
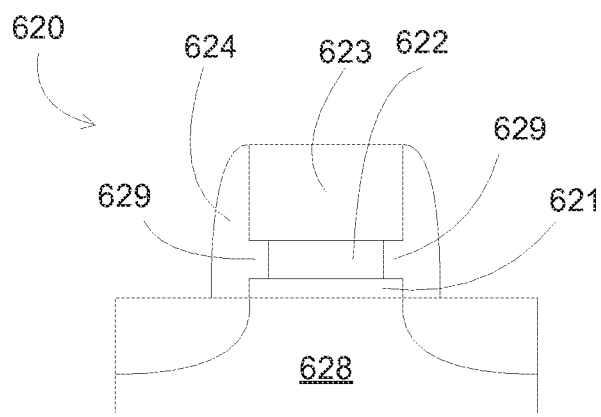

FIGS. 6A-6B illustrate examples of metal gate electrode devices according to some embodiments of the present invention. In FIG. 6A, the metal gate device 610 can be incorporated in integrated circuits, further comprising interconnects for connecting multiples devices. The device 610 is fabricated on a substrate 618, which can be single crystal silicon, although other substrates can be used, such as glass substrates, silicon-germanium substrates, or GaAs substrates. A metal gate electrode device is fabricated on the substrate 618, including a gate dielectric layer 611, a metal gate layer 612 over the gate dielectric layer, and a gate conductor layer 613 over the metal gate layer. The device 610 is isolated from other devices by isolation regions 616, such as shallow trench isolation or local oxidation of silicon (LOCOS) isolation. The device 610 also includes spacers 614 and source and drain regions 615. Other components can be included, such as n or p well region, depending on the type of the semiconductor devices. For example, NMOS devices can be fabricated directly on a p-type substrate, and PMOS devices can be fabricated in an n-well on the p-type substrate. For n-type substrate, NMOS devices can be fabricated in a p-well, while PMOS devices can be fabricated directly on the n-type substrate. Alternatively, for a twin well process, NMOS devices can be fabricated in a p-well, while PMOS devices can be fabricated in a p-well, with both n-well and p-well formed in the substrate.

In some embodiments, the present invention discloses a metal gate layer having an undercut profile designed to reduce a leakage current of the device. The undercut profile can be fabricated by a wet etch process utilizing a dilute metal etch solution. Since the dilute metal etch solution can be highly selective with good etch rate controllability, desired profiles for the undercut can be achieved. The undercut can reduce the electric field between the metal gate and the source/drain regions, resulting in reduced off-state leakage current.

FIG. 6B shows a metal gate electrode device having an undercut profile according to some embodiments of the present invention. The metal gate device 620 can be incorporated in integrated circuits, further comprising interconnects for connecting multiples devices. The device 620 is fabricated on a substrate 628, comprising a gate dielectric layer 621, a metal gate layer 622 over the gate dielectric layer, and a gate conductor layer 623 over the metal gate layer. The metal gate structure is protected by spacers 624. There can be silicide regions (not shown) on the gate conductor layer 623 for improving contact resistance. The device 620 can be similar to the above-described metal gate device, with similar configurations, materials and processing.

The metal gate layer 622 further comprises a recess 629 (a lateral undercut) in its sidewalls, tailored to reduce a leakage current of the device, for example, by reducing the electric field to the source and drain regions. In some embodiments, the spacers 624 can fill in the lateral undercuts 629. The device shown is an exemplary planar device configuration, and other device configurations are also within the scope of the present invention, such as tri-gate transistor configurations, fin-FET configurations, or different types of transistors or devices.

Figure 7A:
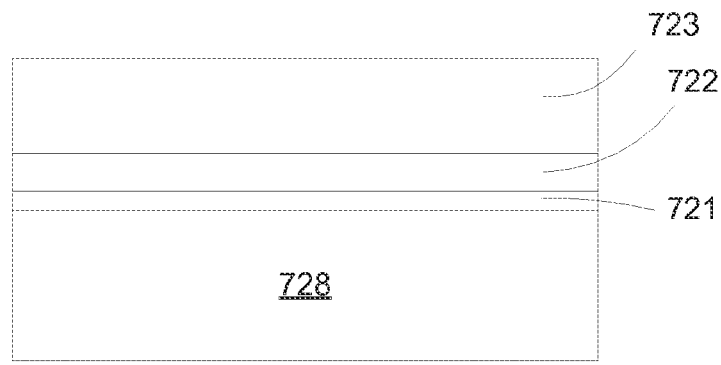
FIGS. 7A-7C illustrates a fabrication sequence for a metal gate stack according to some embodiments of the present invention.
Figure 7B:
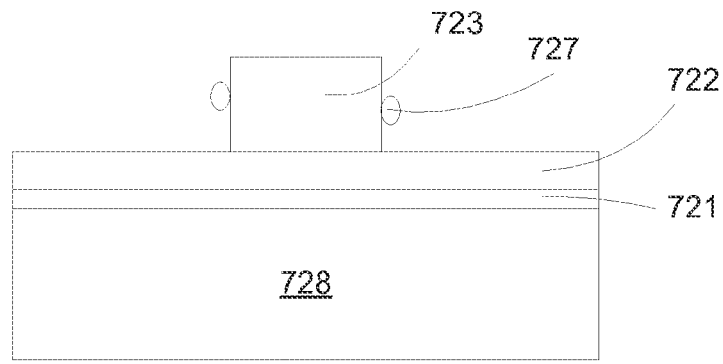
Figure 7C:
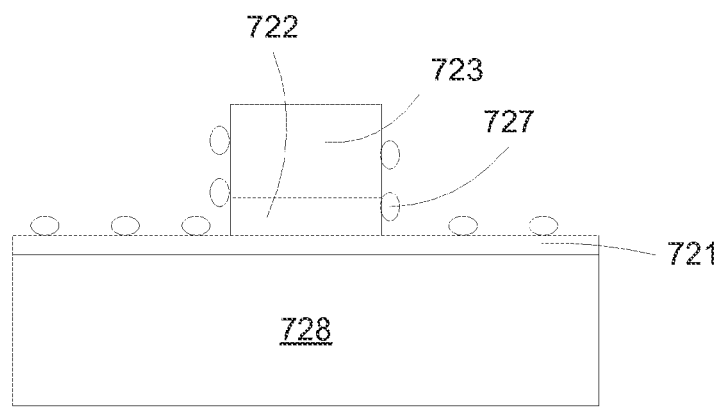

FIGS. 7A-7C illustrates a fabrication sequence for a metal gate stack according to some embodiments of the present invention. In FIG. 7A, blanket layers of gate dielectric 721, metal gate layer 722 and gate conductor layer 723 are deposited on a substrate 728. The substrate 728 can be previously processed, for example, to form device well and isolation regions. The structure shown is exemplary, and other configurations can be used, such as a single metal gate layer instead of a metal gate layer 722 and a gate conductor layer 723, and a gate dielectric layer stack comprising a high-k dielectric layer on a silicon dioxide pedestal layer instead of a single gate dielectric layer 721.

The gate dielectric layer 721 can include any dielectric material, such as silicon dioxide, silicon oxynitride, high-k dielectric (such as hafnium oxide, or hafnium silicon oxynitride), or a combination of layers. Thin gate dielectric is desirable to improve the performance characteristics of semiconductor devices. In some embodiments, the thickness of the gate dielectric can be less than 10 nm, or can be less than 5 nm. The gate dielectric layer 721 can be formed by deposition, thermal growth, or a combination of both. For example, a silicon dioxide pedestal layer can be grown on a silicon substrate, and a high-k dielectric is deposited on the silicon dioxide pedestal layer.

Disposed on the gate dielectric layer 721 is a metal gate layer 722 together with a gate conductor layer 723. Alternatively, the gate conductor layer 723 can be omitted, leaving only a metal gate layer 722. The metal gate layer 722 typically includes a first metal, and the gate conductor 723 can either comprise a poly silicon or a second metal, different from the first metal. In some embodiments, the metal gate layer 722 is a metal-containing layer, having a metal component together with other combination of materials.

The metal gate layer 722 can include a refractory metal or a nitride of a refractory metal, such as tungsten nitride, tantalum nitride, titanium nitride, titanium aluminum nitride, or titanium lanthanum nitride. Alternatively, the metal gate layer 722 can include other metals, including hafnium, zirconium, titanium, tantalum, aluminum, ruthenium, palladium, platinum, cobalt, nickel, and conductive metal oxides (e.g., $RuO_2$). The thickness of the metal gate layer 722 can be less than 20 nm with the gate conductor layer, or can be less than 200 nm without a gate conductor layer.

The gate conductor layer 723 can include doped silicon, such as doped poly silicon or doped amorphous silicon. Alternatively, the gate conductor layer 723 can include a second metal, different from the first metal in the metal gate layer 722. In addition, the gate conductor can be omitted. The thickness of the gate conductor can be less than 200 nm.

The metal gate layer 722 and gate conductor layer 723 can be formed by any methods, such as atomic layer deposition (ALD), physical vapor deposition (PVD), and chemical vapor deposition (CVD).

In FIG. 7B, the gate conductor layer 723 is patterned. In FIG. 7C, the metal gate 722 is patterned. Any patterning process can be used, for example, lithography patterning process using photoresist mask and dry or wet etching. The layers can be patterned using a plasma etch process or a wet etch process.

In some embodiments, the gate conductor layer 723 and a portion of the metal gate layer 722 are patterned using a plasma etch. After the plasma etch, contaminants 727 can be generated, coating the sidewalls and the planar surface of the substrate 728. In some cases, the metal gate layer 722 might not be completely and cleanly etched, forming a non-vertical profile. In addition, the plasma etch process may form residues, including generated residues on the sidewalls and on the substrate surface (e.g., polymer, metal-containing polymer, and high-k contaminants), together with incomplete etched materials from the metal gate electrode.

In some embodiments, the present invention discloses a cleaning process after the patterning of the metal gate stack. The cleaning process can remove residues surrounding the gate stack structure, allowing the fabrication of the transistor device utilizing the gate stack as the gate electrode.

Figure 8A:
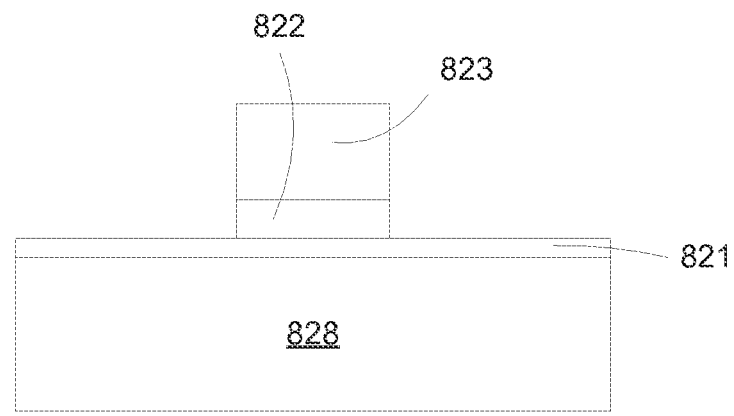
FIGS. 8A-8C illustrate an example of a cleaning process according to some embodiments of the present invention.
Figure 8B:
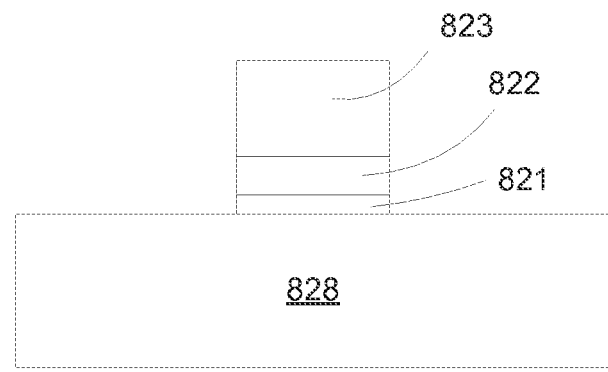
Figure 8C:
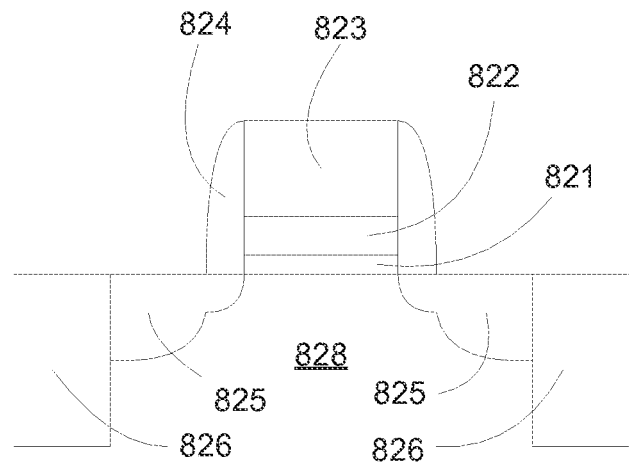

FIGS. 8A-8C illustrate an example of a cleaning process according to some embodiments of the present invention. In FIG. 8A, the metal gate layer 822, or the remaining portion of the metal gate layer 823 after the plasma etch, can be subjected to a wet process utilizing a cleaning solution, which is highly selective to remove the polymer residues without damaging the metal gate layer 822 or the gate dielectric layer 821 on the substrate 828.

In some embodiments, a cleaning process can be used for the metal gate electrode. The cleaning process can include a dilute sulfuric peroxide and HCl, to efficiently remove contaminants formed around a metal gate structure. During the device fabrication process, the substrate is exposed to various environments, which comprise multiple potential sources of contamination. For example, chemicals used in etching or deposition processes can leave deposit on gate structures and on the substrate surfaces as particulates or polymer residue contaminants. Further, in metal gate fabrication processes, the contaminant can be polymer residue species such as O, C, Si, and metal-containing polymer contaminants. In some embodiments, high-k contaminant on the semiconductor surface can also be generated during high-k dielectric processes, such as a high-k anneal following a high-k dielectric deposition. In some embodiments, the plasma etch does not etch completely the metal gate electrode, for example, to prevent over-etching the underlying gate dielectric. The incomplete-etched metal gate layer can be considered as contaminants or residues, and can be cleaned by the cleaning solutions.

The cleaning process can remove the contaminants, including the polymer residues, the metal-containing polymer residues, and the high-k contaminants, while preserving the characteristics of the metal gate structure. The cleaning process uses simple and common chemistries with high selectivity for effectively cleaning unwanted polymer residues, retaining control of critical dimension, and avoiding damage to the metal gate electrode.

In FIG. 8B, the gate dielectric can be removed by another etch process, such as a wet etch using hydrofluoric acid for etching silicon dioxide. In FIG. 8C, after the completion of the metal gate electrode, the substrate can be further processed to form active devices and circuits. For example, additional steps of forming device isolation 826, implanting dopants to form source and drain structures 825, forming gate spacers 824, and shallow junctions. Interconnect metal lines can be included, connecting a plurality of active devices to form an integrated circuit.

In some embodiments, the present invention discloses a wet process utilizing a dilute metal etch chemical to form metal gate electrode configurations with high controllability. The present invention further discloses semiconductor devices and integrated circuits utilizing the fabricated metal gate electrode.

High vertical electric field in the drain extension region can generate tunneling leakage current in MOS field-effect transistors, especially for devices with thin gate dielectric. In a metal gate device, the thickness of the metal gate electrode can be selected to achieve a desired work function and threshold voltage. However, thicker metal gate electrodes can induce higher electric field, leading to higher leakage current. To reduce the leakage current without changing the overall thickness of the metal gate layer, an undercut profile of the metal gate electrode can be designed with lower electric field to the drain region.

In some embodiments, the cleaning process can be used in conjunction with an undercut etching process, thus the metal gate electrode can undergo a cleaning process and an undercut etching process at a same time (or sequentially in a same etching operation). The dilute sulfuric peroxide solution can be very effective, resulting in a clean metal gate electrode with a controlled undercut profile.

Figure 9A:
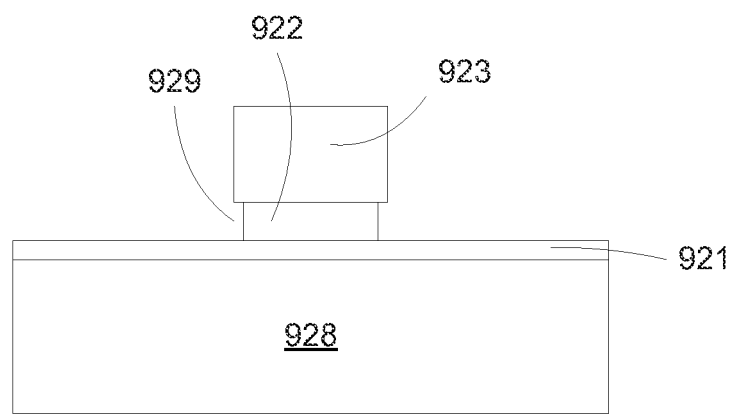
FIGS. 9A-9C illustrate an exemplary fabrication sequence for a metal gate with undercut according to some embodiments of the present invention.
Figure 9B:
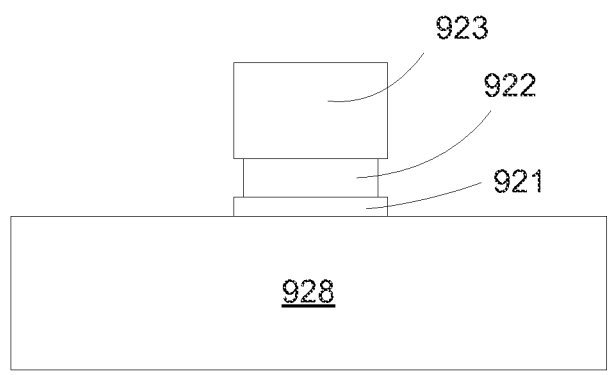
Figure 9C:
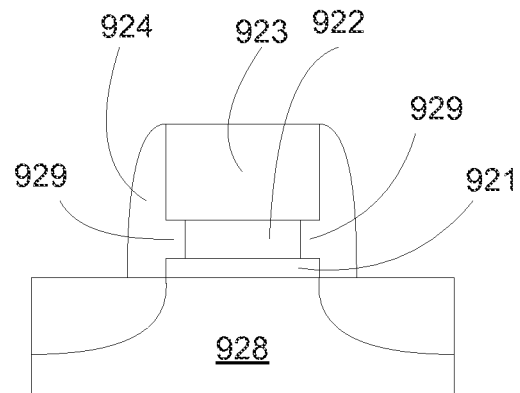

FIGS. 9A-9C illustrate an exemplary fabrication sequence for a metal gate with undercut according to some embodiments of the present invention. In some embodiments, the device metal gate structure can be formed differently. For example, the device can further include undercut for the gate dielectric. The gate dielectric undercut and the metal gate undercut can be similar, or one can be larger or smaller than the other.

In FIG. 9A, the metal gate layer 922, or the remaining portion of the metal gate layer 923 after the plasma etch, can be subjected to a wet process utilizing a cleaning solution, which is highly selective to etch the metal gate layer 922 without damaging the gate dielectric layer 921 on the substrate 928. The substrate 948 can be previously processed, for example, to form device well and isolation regions. The structure shown is exemplary, and other configurations can be used, such as a single metal gate layer instead of a metal gate layer and a gate conductor layer, and a single gate dielectric layer stack instead of a silicon dioxide layer and a high-k gate dielectric layer.

The metal gate layer 922 for NMOS devices can include a metal, such as hafnium, zirconium, titanium, tantalum, aluminum, or their alloys. The metal gate layer 922 for PMOS devices can include ruthenium, palladium, platinum, cobalt, nickel, and conductive metal oxides. The metal gate layer 922 can include a refractory metal or a nitride of a refractory metal, such as titanium nitride. The metal gate layer can include a dopant material, which can be different for NMOS and for PMOS devices, such as titanium aluminum nitride, or titanium lanthanum nitride. The gate conductor layer 923 can include any suitable conductive material, such as materials from the gate metal layer. A difference between the gate metal and gate conductor is that the gate metal is selected for matching a work function with the gate dielectrics while the gate conductor is selected for its high electrical conductivity.

A wet etch, for example, using a dilute sulfuric peroxide and/or HCl, can be performed to form undercuts 929 on the metal gate layer 922. The profile and size of the undercuts 929 can be controlled to achieve a device performance, such as minimum leakage current of the device. Optionally, the gate dielectric layers can be recessed (not shown). In some embodiments, the metal gate layer 922 can be selectively etched by a combination of dry etch and dilute acid oxidant wet etch to form the lateral undercuts 929. The wet process can be followed by a water rinse, for example at room temperature.

In FIG. 9B, the gate dielectric 921 can be removed by another etch process, such as a wet etch using hydrofluoric acid for etching silicon dioxide.

In FIG. 9C, after the completion of the metal gate electrode, the substrate can be further processed to form active devices and circuits. For example, additional steps of forming device isolation 926, implanting dopants to form source and drain structures 925, forming gate spacers 924, and shallow junctions. Interconnect metal lines can be included, connecting a plurality of active devices to form an integrated circuit.

Other fabrication sequences can be used. For example, the gate dielectric layers 921 can be patterned after forming the lateral undercuts 929.

In some embodiments, the present invention discloses combinatorial workflow for evaluating process conditions for gate stack formation, such as metal gate stack using high-k dielectrics. High productivity combinatorial processing can be a fast and economical technique for electrically screening photoresist chemicals to determine their possible side effects on the transistor performance, avoiding potentially costly device process development through proper selection of photoresist strip chemicals.

In a typical device fabrication process, different device portions can be exposed to different wet processing chemicals under different process conditions, and therefore, in some embodiments, the present invention discloses combinatorially developing a fabrication process for forming metal gate stacks in NMOS and PMOS devices.

For example, during a device fabrication process, a metal gate stack is formed, having a metal gate electrode disposed on a high-k gate dielectric layer disposed on a semiconductor substrate. The metal gate stack can be exposed to a wet cleaning chemical to remove any contaminants or residues formed during the fabrication of the metal gate stack. Further, the wet cleaning chemical can selectively etch the metal portion of the metal gate stack, forming an undercut for the metal gate stack. Different conditions can be used, for example, different wet cleaning chemicals, such as dilute sulfuric peroxide and HCl, different application sequences, such as applying dilute sulfuric peroxide before, after, or between the application of HCl, different chemical temperature, such as between room temperature to 85 C, different chemical concentration, such as 1 part per 1000 diluted HCl to 100% concentrated HCl, and different cleaning time, such as between 10 seconds to 10 minutes.

In some embodiments, the present invention discloses methods to evaluate the effects of the cleaning chemicals under similar configuration. As an example, a dilute metal etch solution at 25 C is applied for 2 minutes to a metal gate stack having a metal electrode on a high-k dielectric layer on a substrate. The metal gate stack forms a NMOS or PMOS device structure that can enable characterization to assess the integrity and the formation of the metal gate stack after the cleaning process.

As another example, during the fabrication of n-type, e.g., NMOS, or p-type, e.g., PMOS, device, the high-k dielectric area of the p-type (or n-type, respectively) device is protected from being processed, for example, by a photoresist masking. In addition, different metal material can be used for the metal gate stacks of NMOS or PMOS devices. Thus in some embodiments, the metal gate stacks are characterized after being cleaned to evaluating the effects of the different process conditions and cleaning chemicals.

In some embodiments, the present invention discloses characterizing the metal gate stacks for combinatorially evaluating the effects of post gate etch cleaning process. For example, SEM can be used to evaluate the effective of the cleaning process or to evaluate the degree of the metal undercut. In addition, the same cleaning chemicals and conditions can be repeated to evaluate the process window, such as the distribution of the size of the metal undercut.

Figure 10:
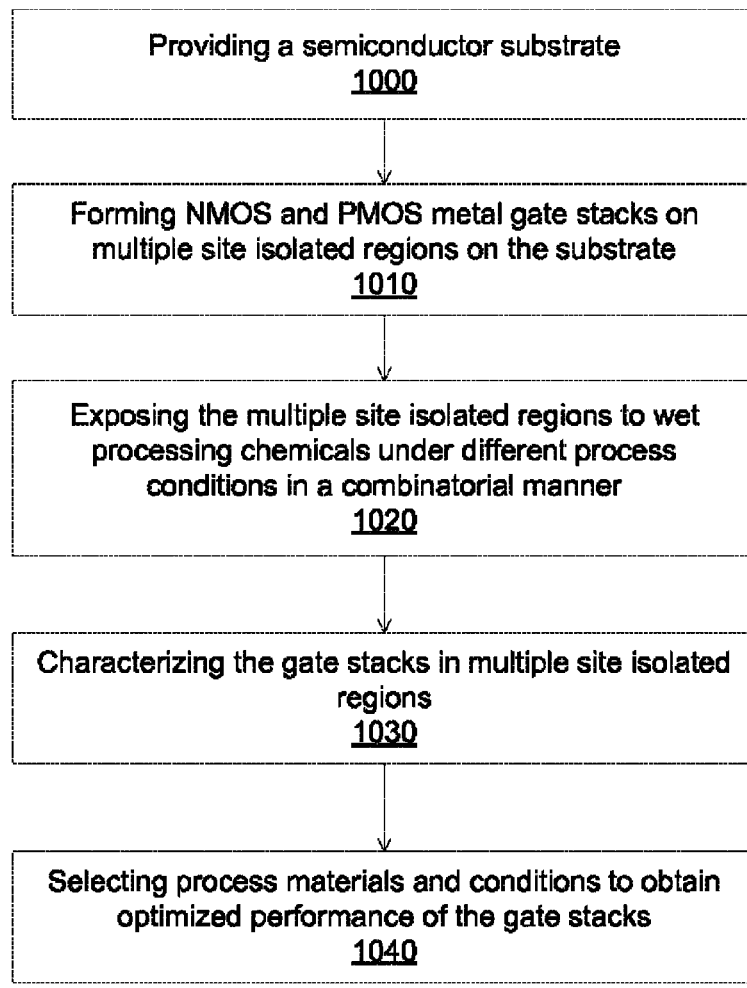
FIG. 10 illustrates an example of a flowchart for combinatorially developing a cleaning process for a metal gate stack formation.

FIG. 10 illustrates an example of a flowchart for combinatorially developing a cleaning process for a metal gate stack formation. In operation 1000, a semiconductor substrate is provided. In operation 1010, multiple metal gate stacks are formed on multiple site isolated regions of the substrate. Each site isolated regions can include one or more gate stack structures, for example, an NMOS gate stack, a PMOS gate stack, an NMOS and a PMOS gate stacks, or multiple PMOS and NMOS gate stacks. P-well can be fabricated on n-type substrate before forming NMOS gate stack. N-well can be fabricated on p-type substrate before forming PMOS gate stack. P-well and n-well can be fabricated on a substrate before forming NMOS and PMOS gate stacks. In addition, different metals can be used in the metal layer of the NMOS and PMOS gate stacks.

In operation 1020, the site isolated regions are exposed to cleaning chemicals in a combinatorial manner. The combinatorial parameters can include different cleaning chemicals, such as different dilute metal etch solutions of HCl and dilute sulfuric peroxide. The combinatorial parameters can include different sequences of applying cleaning chemicals, such as exposing the gate stacks in different site isolated regions to a sequence of HCl before dilute sulfuric peroxide, to a sequence of dilute sulfuric peroxide before HCl, to a sequence of HCl before dilute sulfuric peroxide before another HCl, to a sequence of dilute sulfuric peroxide before HCl before another dilute sulfuric peroxide, or to other sequences of dilute metal etch solutions.

The combinatorial parameters can include different solution temperatures, such as between room temperature, e.g., about 15 C to 25 C, to about 85 C. For example, one or more site isolated regions can be exposed to HCl or dilute sulfuric peroxide at room temperature. One or more other site isolated regions can be exposed to HCl or dilute sulfuric peroxide at 45

C. The temperature variation can be 5 C between room temperature and 85 C, between 10 C between room temperature and 85 C, or between any temperature range between room temperature and 85 C. In addition, different chemicals can be at different temperatures. For example, HCl solution can be at 45 C while dilute sulfuric acid can be at 50 C.

The combinatorial parameters can include different concentration, such as dilute to concentrated chemical solutions. For example, HCl can be diluted with water or deionized water to be between 1:1000 dilution (e.g., 1 part of HCl in 1000 parts of water) and fully concentrated (e.g., 100% HCl solution). Dilute sulfuric acid can include between 10 wt % to 30 wt % of sulfuric acid, between 10 wt % to 30 wt % of hydrogen peroxide, between 0 to 100 ppm of HF, and between 50 wt % to 80 wt % of water. In the combinatorial process, one or more site isolated regions can be exposed to a chemical at 1:100 concentration. One or more other site isolated regions can be exposed to the same or a different chemical at 100% concentration. The concentration variation can be 1 wt %, 5 wt % or 10 wt % between the minimum concentration (e.g., 1:1000 concentration) and 100% concentration. In addition, different chemicals can be at different concentrations. For example, HCl solution can be at 65 wt % concentration while dilute sulfuric acid can be at 50 wt % concentration, e.g., a mixture of 50 wt % of sulfuric acid and hydrogen peroxide in 50 wt % of water.

The combinatorial parameters can include different processing times, such as between 10 seconds and 10 minutes. For example, in the combinatorial process, one or more site isolated regions can be exposed to a chemical for 1 minute. One or more other site isolated regions can be exposed to the same or a different chemical for 5 minutes.

In operation 1030, the metal gate stacks in multiple site isolated regions are characterized. The characterization can include structural characterization, such as SEM, and electrical characterization, such as the threshold voltage of the devices, or the switching behaviors of the NMOS and PMOS devices. For example, the characterization can include SEM observation of contamination and residue removal, or SEM observation of the amount of metal undercut in NMOS and PMOS devices. In addition, average values and distributions of the measurements can be evaluated. The average values can indicate the performance of the NMOS and PMOS devices, and the measurement distribution can indicate a performance variation of a same fabrication process.

In operation 1040, process materials and process conditions are selected for the fabrication of the metal gate stacks.

The following description describes sample processes using test structures. Other test or actual structures can also be used. A combinatorial testing process is described involving exposing the metal gate stack to wet chemicals before characterizing the NMOS and PMOS devices having the metal gate stacks. In some embodiments, process conditions are screened for optimizing a metal gate stack formation. The screening process can include forming a NMOS and/or PMOS metal gate stack on a semiconductor substrate, combinatorially processing multiple regions of the semiconductor substrate with different cleaning chemicals under different process conditions, wherein the chemicals and process conditions are varied across the multiple regions of the semiconductor substrate, and then characterizing the NMOS and PMOS devices, for cleaning effective and for metal undercut formation.

In some embodiments, a control device can be formed in a control region on the semiconductor substrate. The control device can possess similar structure and fabrication process as the test devices, but with a standard cleaning chemical and process, or without any cleaning process. The control device can be characterized, and the characterization of the control device can be compared with those of the test devices.

A combinatorial process can be performed for evaluating the post gate etch development. The combinatorial process can identify that there is a strong undercut bias for NMOS and PMOS devices. For example, PMOS can have a metal undercut in the range of 1-2.5 nm while the NMOS can have footing (e.g., no undercut) in the 1-2 nm range. This indicates that the undercut formation for NMOS can need a longer exposure time, a higher concentration chemical or a higher temperature for the chemical solution.

The combinatorial process can identify that there can be different effects of time exposure for certain metal etch chemicals on the metal electrode of the metal gate stack. For example, longer exposure of HCl and dilute sulfuric peroxide (such as between 50 seconds and 95 seconds) does not show significant difference in the undercut dimension of TiN, but can strongly reduce the variation in the undercut dimension. This can indicate that a cleaning process (e.g., an HCl exposure) might not be aggressive enough (e.g., might need longer time, higher concentration, or higher temperature) to remove etch residues, which can block the etching of the dilute sulfuric peroxide.

The combinatorial process can identify that there can be different effects of chemical temperature for certain metal etch chemicals on the metal electrode of the metal gate stack. For example, higher temperature of 45 C exposure of HCl can produce more undercut of TiN than at 25 C.

The combinatorial process can identify that there can be different effects of time and temperature for certain metal etch chemicals on the metal electrode of the metal gate stack. For example, longer exposure of higher temperature of HCl before dilute sulfuric peroxide, or longer exposure of dilute sulfuric peroxide can produce higher undercut of TiN.

The combinatorial process can identify that there can be different effects of concentration for certain metal etch chemicals on the metal electrode of the metal gate stack. For example, more aggressive HCl (e.g., longer time, higher concentration, or higher temperature) can increase undercut on PMOS metal gate stack. Also, higher concentration of dilute sulfuric peroxide can greatly reduce the variation in TiN undercut dimension.

The combinatorial process can identify that there can be different effects on the sequence of certain metal etch chemicals on the metal electrode of the metal gate stack. For example, application of HCl after dilute sulfuric peroxide almost has no effect on the undercut dimension of TiN.

Figure 11:
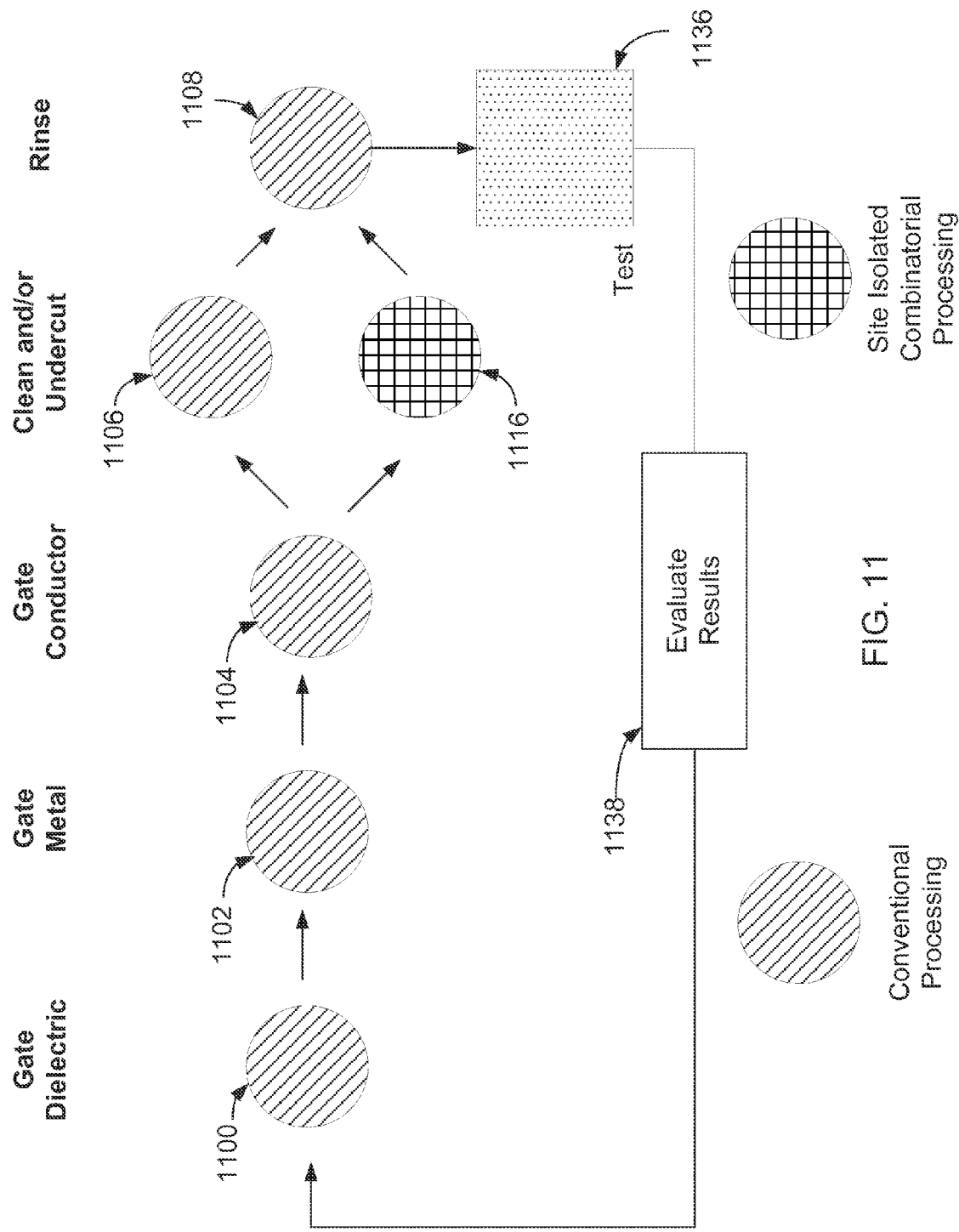
FIG. 11 illustrates a flow diagram for forming simple test structures according to some embodiments of the present invention.

FIG. 11 illustrates a flow diagram for forming simple test structures according to some embodiments of the present invention. As discussed above, several of the layers or process steps provide opportunities to apply combinatorial techniques to the development and investigation of the materials and treatments for the layers. For evaluating post metal gate etch development, parameter candidates include the gate dielectric layer (e.g., silicon oxide or high-k material), the metal gate electrode layer, the metal gate conductor layer, and the post gate etch cleaning process. As mentioned previously, examples of suitable high-k dielectric layers include hafnium oxide, zirconium oxide, aluminum oxide, or any mixture combination, etc. For example, hafnium oxide and hafnium silicon oxide are the material most often used as the high-k dielectric layer for metal gate stack devices. The high-k dielectric layer may be deposited using chemical vapor deposition (CVD), atomic layer deposition (ALD), or plasma enhanced CVD or ALD. The effects of post gate etch cleaning process on the metal gate stack (including the gate dielectric layer, the metal gate electrode, and the metal gate conductor) may be investigated using HPC techniques by varying process parameters such as material, deposition process condition, surface preparation process, interface layer, cleaning chemicals, cleaning process conditions, and cleaning sequence. These are meant to be illustrative parameters and those skilled in the art will be able to apply HPC techniques to any of the commonly used process parameters.

A process step that may be investigated using HPC techniques includes the cleaning process. The cleaning process can be designed to clean the metal gate stack together with forming an undercut structure on the metal layer of the metal gate stack. The cleaning process may be investigated using HPC techniques by varying process parameters such as cleaning chemicals (such as HCl and dilute sulfuric peroxide), chemical concentration, exposure time, chemical temperature, chemical stirring rate, etc. For example, cleaning chemicals can be selected from a list of commercially available chemicals of dilute metal etch solutions, in addition to specially designed chemicals. These are meant to be illustrative parameters and those skilled in the art will be able to apply HPC techniques to any of the commonly used process parameters.

Another layer that may be investigated using HPC techniques includes the metal gate electrode layer. Examples of suitable metal gate electrode materials include hafnium, zirconium, titanium, tantalum, aluminum, ruthenium, palladium, platinum, cobalt, nickel, conductive metal oxides, their alloys, nitrides and nitride alloys. In addition, doped metal gate electrode layers can be investigated. In some embodiments, different dopants can be used for NMOS and PMOS metal gate electrode layers.

Typically, PVD is the preferred method of deposition for the metal gate electrode layer. The deposition of the metal electrode layer by PVD may be investigated using HPC techniques by varying process parameters such as material, power, pressure, target to substrate distance, atomic ratio, etc. These are meant to be illustrative parameters and those skilled in the art will be able to apply HPC techniques to any of the commonly used process parameters.

Returning to FIG. 11, through the use of a combination of conventional and combinatorial processing systems (i.e. systems capable of processing multiple isolated regions on a single substrate) a number of trajectories through the various systems illustrated in the flow diagram of FIG. 11 can be envisioned. In FIG. 11, the gate dielectric layer may be deposited in a conventional processing manner, 1100, in some embodiments where the gate dielectric layer is not a variable. The metal electrode layer may be deposited in a conventional processing manner, 1102, in some embodiments where the metal electrode is not a variable. The metal conductor layer may be deposited in a conventional processing manner, 1104, in some embodiments where the metal electrode is not a variable. As discussed previously, the cleaning process may be processed in a conventional processing manner, 1106, or in a site isolated combinatorial processing manner, 1116. A rinse process, such as a deionized water rinse, may be processed in a conventional processing manner, 1108. After the deposition of the various layers and subsequent processing, the various NMOS and PMOS metal gate stacks represented by each of the site isolated regions may be tested in step 1136, and the results evaluated in step, 1138. As discussed previously, the results will form the basis for additional cycles of investigation through HPC techniques to identify materials and process conditions that evaluate the suitability of cleaning processes in devices having the given gate dielectric and metal gate electrode and conductor.

Using the simple diagram in FIG. 11, there are two possible trajectories through the process sequence, which encompass all of the possible combinations of conventional and combinatorial processing illustrated. Those skilled in the art will understand that HPC techniques may be applied to other processes not illustrated such as anneal treatments, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

The illustrated simple diagram represents a possible evaluation process for the effects of various cleaning processes and chemicals on a specific gate dielectric and metal gate electrode and conductor. The variables can include other process windows, such as the exposure temperature, time, and concentration.

Figure 12:
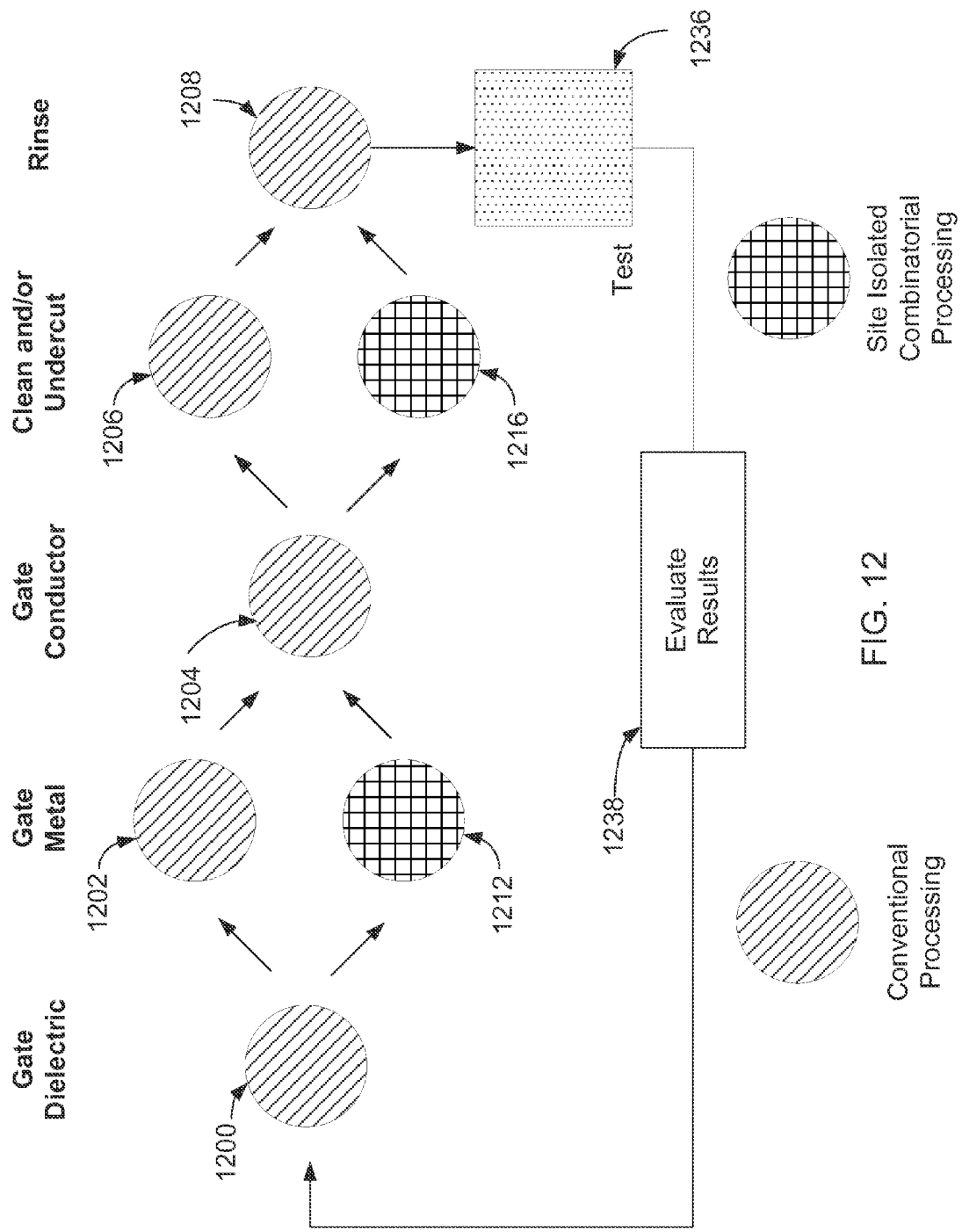
FIG. 12 illustrates a flow diagram for forming another exemplary test structure evaluation according to some embodiments of the present invention.

FIG. 12 illustrates a flow diagram for forming another exemplary test structure evaluation according to some embodiments of the present invention. Additional layers can be included in the test methodology, including the metal gate electrode layer. Through the use of a combination of conventional and combinatorial processing systems (i.e. systems capable of processing multiple isolated regions on a single substrate) a number of trajectories through the various systems illustrated in the flow diagram of FIG. 12 can be envisioned. In FIG. 12, the gate dielectric layer may be deposited in a conventional processing manner, 1200, in some embodiments where the gate dielectric layer is not a variable. As discussed previously, the metal gate layer may be processed in a conventional processing manner, 1202, or in a site isolated combinatorial processing manner, 1212. The gate conductor layer may be deposited in a conventional processing manner, 1204, in some embodiments where the metal electrode is not a variable. As discussed previously, the cleaning process may be processed in a conventional processing manner, 1206, or in a site isolated combinatorial processing manner, 1216. A rinse process, such as a deionized water rinse, may be processed in a conventional processing manner, 1208. After the deposition of the various layers and subsequent processing, the various NMOS and PMOS metal gate stacks represented by each of the site isolated regions may be testing in step 1236, and the results evaluated in step, 1238. As discussed previously, the results will form the basis for additional cycles of investigation through HPC techniques to identify materials and process conditions that evaluate the suitability of cleaning processes with respect to different metal gate electrode in devices having the given gate dielectric and metal gate conductor.

Using the simple diagram in FIG. 12, there are four possible trajectories through the process sequence. These four trajectories encompass all of the possible combinations of conventional and combinatorial processing illustrated. Those skilled in the art will understand that HPC techniques may be applied to other processes not illustrated such as anneal treatments, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Figure 13:
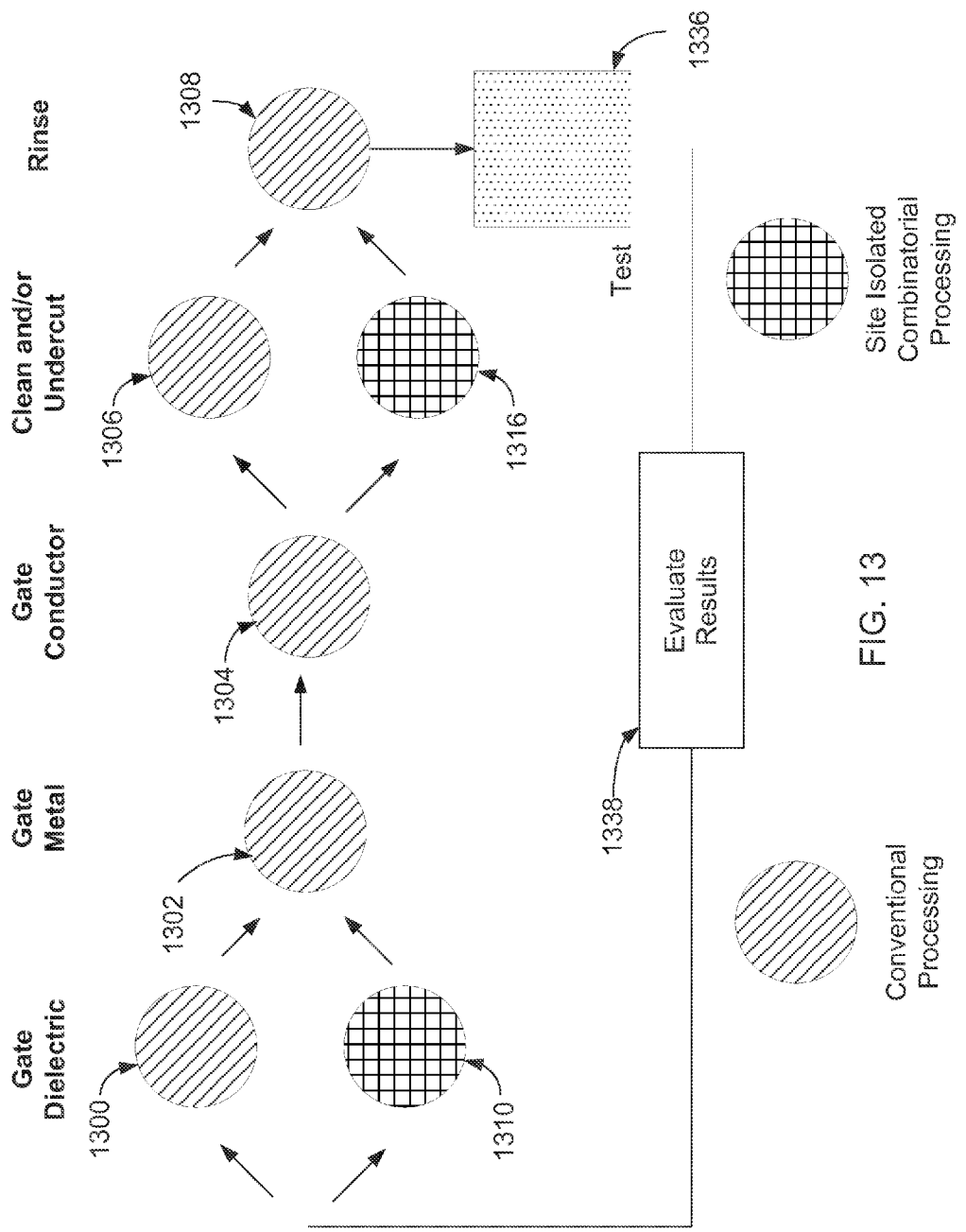
FIG. 13 illustrates a flow diagram for forming another exemplary test structure evaluation according to some embodiments of the present invention.

FIG. 13 illustrates a flow diagram for forming another exemplary test structure evaluation according to some embodiments of the present invention. Additional layers can be included in the test methodology, including the gate dielectric layer. Through the use of a combination of conventional and combinatorial processing systems (i.e. systems capable of processing multiple isolated regions on a single substrate) a number of trajectories through the various systems illustrated in the flow diagram of FIG. 13 can be envisioned. In FIG. 13, the gate dielectric layer may be deposited in a conventional processing manner, 1300, or in a site isolated combinatorial processing manner, 1310. The metal gate layer may be processed in a conventional processing manner, 1302, in some embodiments where the gate dielectric layer is not a variable. The gate conductor layer may be deposited in a conventional processing manner, 1304, in some embodiments where the metal electrode is not a variable. As discussed previously, the cleaning process may be processed in a conventional processing manner, 1306, or in a site isolated combinatorial processing manner, 1316. A rinse process, such as a deionized water rinse, may be processed in a conventional processing manner, 1308. After the deposition of the various layers and subsequent processing, the various NMOS and PMOS metal gate stacks represented by each of the site isolated regions may be testing in step 1336, and the results evaluated in step, 1338. As discussed previously, the results will form the basis for additional cycles of investigation through HPC techniques to identify materials and process conditions that evaluate the suitability of cleaning processes with respect to different gate dielectric in devices having the given metal gate electrode and conductor.

Using the simple diagram in FIG. 13, there are four possible trajectories through the process sequence. These four trajectories encompass all of the possible combinations of conventional and combinatorial processing illustrated. Those skilled in the art will understand that HPC techniques may be applied to other processes not illustrated such as anneal treatments, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Figure 14:
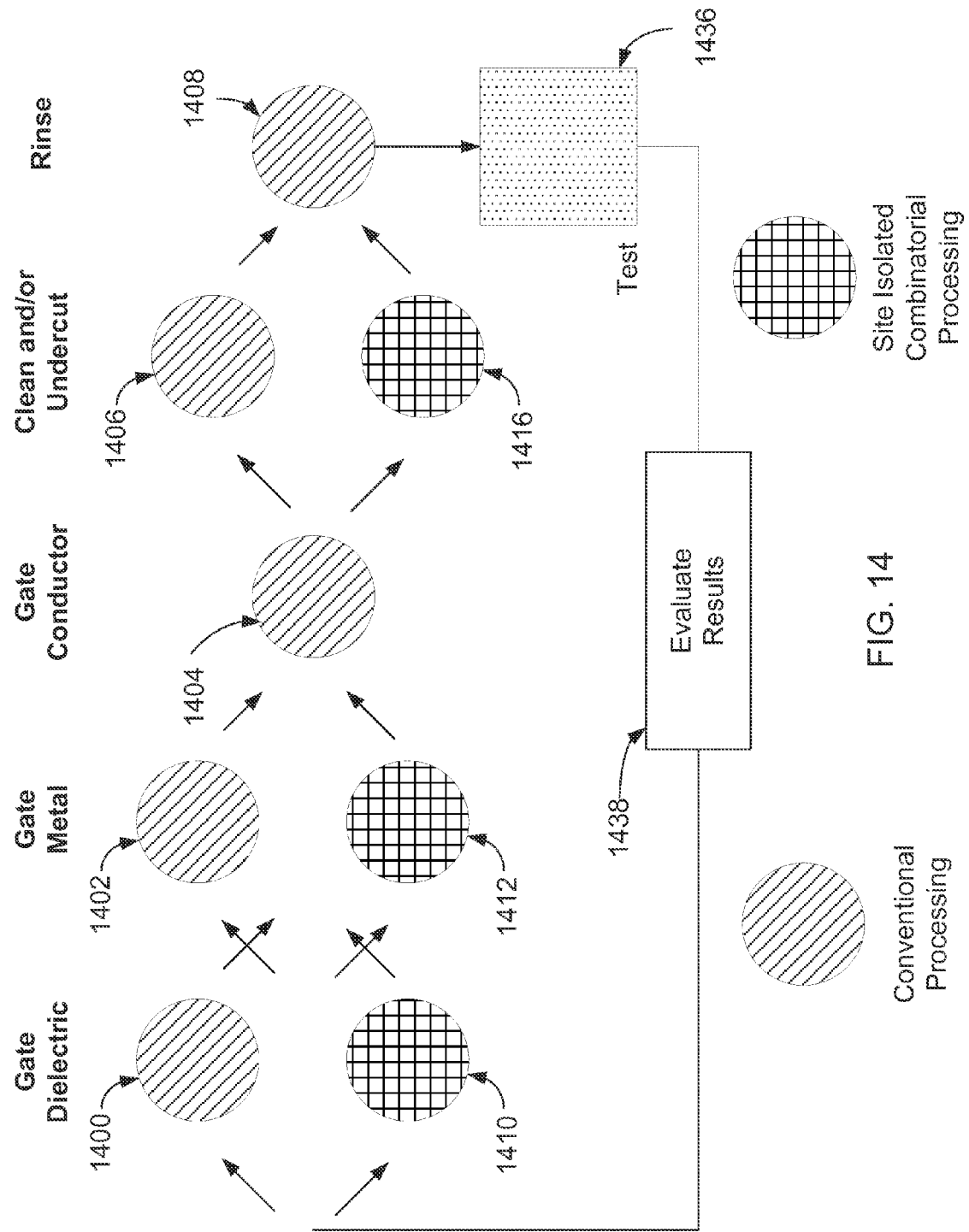
FIG. 14 illustrates a flow diagram for forming another exemplary test structure evaluation according to some embodiments of the present invention.

FIG. 14 illustrates a flow diagram for forming another exemplary test structure evaluation according to some embodiments of the present invention. Additional layers can be included in the test methodology, including the metal gate electrode layer and the gate dielectric. Through the use of a combination of conventional and combinatorial processing systems (i.e. systems capable of processing multiple isolated regions on a single substrate) a number of trajectories through the various systems illustrated in the flow diagram of FIG. 14 can be envisioned. In FIG. 14, the gate dielectric layer may be deposited in a conventional processing manner, 1400, or in a site isolated combinatorial processing manner, 1410. As discussed previously, the metal gate layer may be processed in a conventional processing manner, 1402, or in a site isolated combinatorial processing manner, 1412. The gate conductor layer may be deposited in a conventional processing manner, 1404, in some embodiments where the metal electrode is not a variable. As discussed previously, the cleaning process may be processed in a conventional processing manner, 1406, or in a site isolated combinatorial processing manner, 1416. A rinse process, such as a deionized water rinse, may be processed in a conventional processing manner, 1408. After the deposition of the various layers and subsequent processing, the various NMOS and PMOS metal gate stacks represented by each of the site isolated regions may be testing in step 1436, and the results evaluated in step, 1438. As discussed previously, the results will form the basis for additional cycles of investigation through HPC techniques to identify materials and process conditions that evaluate the suitability of cleaning processes with respect to different gate dielectric and metal gate electrode in devices having the given metal gate conductor. As discussed previously, the results will form the basis for additional cycles of investigation through HPC techniques to identify materials and process conditions that evaluate the suitability of cleaning processes with respect to different gate dielectric and metal gate electrode in devices having the given metal gate conductor.

Using the simple diagram in FIG. 14, there are eight possible trajectories through the process sequence. These eight trajectories encompass all of the possible combinations of conventional and combinatorial processing illustrated. Those skilled in the art will understand that HPC techniques may be applied to other processes not illustrated such as anneal treatments, cleaning, rinsing, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for screening post gate etch clean processes in a combinatorial manner, the method comprising
   forming a dielectric layer disposed on a substrate;
   forming a metal-containing layer on the dielectric layer;
   forming a conductor layer on the metal-containing layer;
   patterning the conductor layer and the metal-containing layer to form metal gate stacks;
   defining site isolated regions on the substrate, wherein each site isolated region comprises at least one metal gate stack;
   applying chemicals to each of the site isolated regions, wherein the chemicals comprise at least hydrochloric acid and diluted sulfuric peroxide, wherein at least one of the composition or the application condition of the chemicals is varied in a combinatorial manner between the site isolated regions; and
   measuring a structural characteristic of the metal-containing layer in the metal gate stacks within each site isolated region.

2. The method of claim 1 wherein varying at least one of the composition or the application condition of the chemicals in a combinatorial manner between the site isolated regions comprises varying a sequence of the chemical applications.

3. The method of claim 1 wherein varying at least one of the composition or the application condition of the chemicals in a combinatorial manner between the site isolated regions comprises varying a concentration of the chemicals.

4. The method of claim 1 wherein varying at least one of the composition or the application condition of the chemicals in a combinatorial manner between the site isolated regions comprises varying an application time of the chemicals.

5. The method of claim 1 wherein varying at least one of the composition or the application condition of the chemicals in a combinatorial manner between the site isolated regions comprises varying a temperature of the chemicals.

6. The method of claim 1 wherein measuring the structural characteristic of the metal-containing layer comprises measuring a residue removal, wherein the residue is generated from the patterning process.

7. The method of claim 1 wherein measuring the structural characteristic of the metal-containing layer in the metal gate stack comprises measuring an undercut of the metal gate stack,
   wherein measuring an undercut comprises measuring an undercut bias between NMOS and PMOS devices utilizing the metal gate stacks.

8. The method of claim 1 wherein measuring the structural characteristic of the metal-containing layer in the metal gate stack comprises measuring an undercut of the metal gate stacks,
   wherein measuring the undercut comprises measuring a distribution of the undercut of the metal gate electrodes stacks.

9. A method for screening post gate etch clean processes in a combinatorial manner, the method comprising
   forming a dielectric layer disposed on a substrate;
   defining two or more site isolated regions on the dielectric layer;
   forming a metal-containing layer in each site isolated region, wherein the metal-containing layer is disposed on the dielectric layer, and wherein at least one of the material or the process condition of the forming of the metal-containing layer is varied in a combinatorial manner between the site isolated regions;
   forming a conductor layer on the metal-containing layer;
   patterning the conductor layer and the metal-containing layer to form metal gate stacks;
   applying chemicals to each of the site isolated regions, wherein the chemicals comprise at least hydrochloric acid and diluted sulfuric peroxide, wherein at least one of the composition or the application condition of the chemicals is varied in a combinatorial manner between the site isolated regions; and
   measuring a structural characteristic of the metal-containing layer in the metal gate stacks within each site isolated region.

10. The method of claim 9 wherein varying at least one of the composition or the application condition of the chemicals in a combinatorial manner between the site isolated regions comprises varying a sequence of the chemical applications.

11. The method of claim 9 wherein varying at least one of the composition or the application condition of the chemicals in a combinatorial manner between the site isolated regions comprises varying a concentration of the chemicals, an application time of the chemicals, or a temperature of the chemicals.

12. The method of claim 9 wherein measuring the structural characteristic of the metal-containing layer comprises measuring a residue removal, wherein the residue is generated from the patterning process.

13. The method of claim 9 wherein measuring the structural characteristic of the metal-containing layer in the metal gate stack comprises measuring an undercut of the metal gate stack,
   wherein measuring the undercut comprises at least one of
      measuring an undercut bias between NMOS and PMOS devices utilizing the metal gate stacks, or
      measuring a distribution of the undercut of the metal gate stacks.

14. The method of claim 9 wherein varying at least one of the material or the process condition of the forming of the metal-containing layer in a combinatorial manner between the site isolated regions comprises varying a dopant in the metal-containing layer.

15. A method for screening post gate etch clean processes in a combinatorial manner, the method comprising
   defining two or more site isolated regions on a substrate;
   forming a dielectric layer in each site isolated region, wherein the dielectric layer is disposed on the substrate, and wherein at least one of the material or the process condition of the forming of the dielectric layer is varied in a combinatorial manner between the site isolated regions;
   forming a metal-containing layer in each site isolated region, wherein the metal-containing layer is disposed on the dielectric layer, and wherein at least one of the material or the process condition of the forming of the metal-containing layer is varied in a combinatorial manner between the site isolated regions;
   forming a conductor layer on the metal-containing layer;
   patterning the conductor layer and the metal-containing layer to form metal gate stacks;
   applying chemicals to each of the site isolated regions, wherein the chemicals comprise at least hydrochloric acid and diluted sulfuric peroxide, wherein at least one of the composition or the application condition of the chemicals is varied in a combinatorial manner between the site isolated regions; and
   measuring a structural characteristic of the metal-containing layer in the metal gate stacks within each site isolated region.

16. The method of claim 15 wherein varying at least one of the composition or the application condition of the chemicals in a combinatorial manner between the site isolated regions comprises varying a sequence of the chemical applications.

17. The method of claim 15 wherein varying at least one of the composition or the application condition of the chemicals in a combinatorial manner between the site isolated regions comprises varying a concentration of the chemicals, an application time of the chemicals, or a temperature of the chemicals.

18. The method of claim 15 wherein measuring the structural characteristic of the metal-containing layer comprises measuring a residue removal, wherein the residue is generated from the patterning process.

19. The method of claim 15 wherein measuring the structural characteristic of the metal-containing layer in the metal gate stack comprises measuring an undercut of the metal gate stack,
   wherein measuring the undercut comprises at least one of
      measuring an undercut bias between NMOS and PMOS devices utilizing the metal gate stacks, or
      measuring a distribution of the undercut of the metal gate stacks.

20. The method of claim 15 wherein varying at least one of the material or the process condition of the forming of the metal-containing layer in a combinatorial manner between the site isolated regions comprises varying a dopant in the metal-containing layer.

* * * * *